United States Patent [19]

Fendley et al.

[11] 3,939,559

[45] Feb. 24, 1976

[54] METHODS OF SOLID-PHASE BONDING MATING MEMBERS THROUGH AN INTERPOSED PRE-SHAPED COMPLIANT MEDIUM

[75] Inventors: Richard L. Fendley; Gerhard E. Hoenig; George Poehlmann; John M. Prendergast, Jr., all of Indianapolis, Ind.

[73] Assignees: Western Electric Company, Inc., New York, N.Y.; Bell Telephone Laboratories, Incorporated, Murray Hill, N.J.

[22] Filed: Mar. 1, 1974

[21] Appl. No.: 447,419

Related U.S. Application Data

[62] Division of Ser. No. 294,755, Oct. 3, 1972, Pat. No. 3,834,604.

[52] U.S. Cl. ............... 29/628; 29/630 R; 228/141; 228/180 R; 228/106
[51] Int. Cl.² .................................. H01R 43/00
[58] Field of Search ... 29/203 D, 576 S, 628, 471.1, 29/471.3, 472.3, 475, 630 C, 630 B, 630 D; 174/52 PG:DIG. 3; 228/4, 5, 6, 13, 36, 40; 113/119

[56] References Cited
UNITED STATES PATENTS

| | | | |
|---|---|---|---|
| 1,132,094 | 3/1915 | Hosford | 200/267 |
| 2,127,648 | 8/1938 | Mehlhouse | 29/155.55 |
| 2,571,040 | 10/1951 | Juvinall et al. | 29/630 C |
| 2,827,809 | 3/1958 | Beam | 78/97 |
| 3,380,155 | 4/1968 | Burks | 29/591 |
| 3,431,637 | 3/1969 | Caracciolo | 29/588 |
| 3,517,438 | 6/1970 | Johnson et al. | 29/576 S |
| 3,537,175 | 11/1970 | St. Clair et al. | 113/119 R |
| 3,630,429 | 12/1971 | Matsuda et al. | 228/3 |
| 3,698,618 | 10/1972 | Helda | 29/471.1 |
| 3,724,068 | 4/1973 | Galli | 228/6 |
| 3,803,711 | 4/1974 | Dubuc et al. | 29/630 C |

*Primary Examiner*—C. W. Lanham
*Assistant Examiner*—James R. Duzan
*Attorney, Agent, or Firm*—D. D. Bosben

[57] ABSTRACT

Methods of producing consistently uniform and high strength solid-phase (preferably thermocompression) bonds between two mating members and, in particular, between multiple micro-size lead-frame-fabricated electrical ribbon leads and thin film terminals formed on glass or ceramic circuit substrates, for example, through the utilization of at least one, but preferably two or more, interposed and specially contoured compliant contacts per lead. The pre-shaping of the compliant contacts into essentially triangular cross-section (preferably accomplished by initially roll bonding contact-forming precious metal wire(s) to lead-frame forming strip stock), has been found to be very beneficial and significant in establishing a sufficient degree of inherent compliancy to minimize, if not eliminate, force-induced circuit substrate failures due to fracture or glass cavitation, and to provide sufficient plastic deformation to insure the attainment of reliable and consistent mechanical cleaning, metal-to-metal adhesion and bond definition at the bond interfaces. The utilization of two or more pre-shaped compliant contacts per bond area, so as to produce redundant bonds, further insures against total bond and/or substrate failures due to the presence of random micro-imperfections in or blemishes on the mating bond surfaces.

13 Claims, 18 Drawing Figures

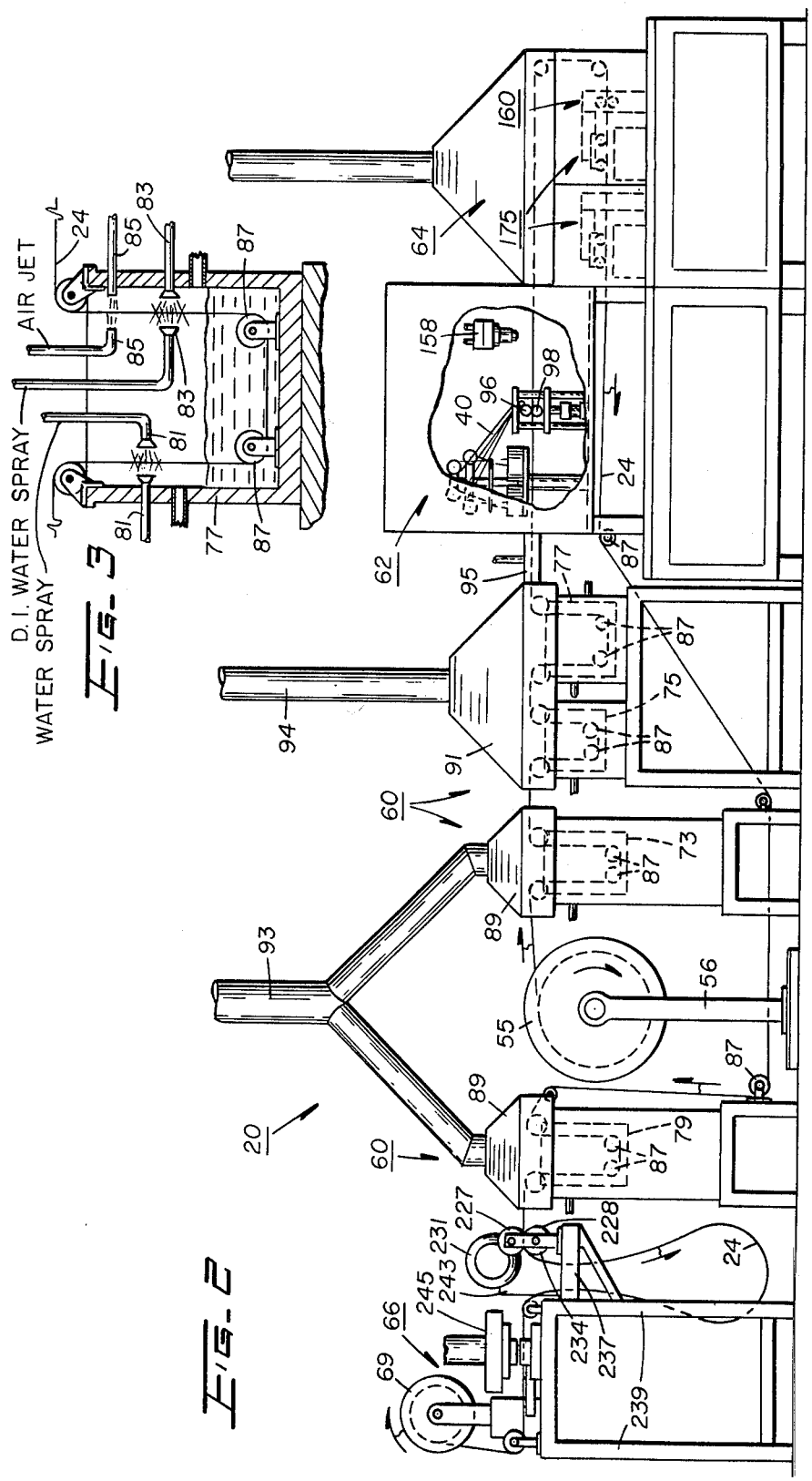

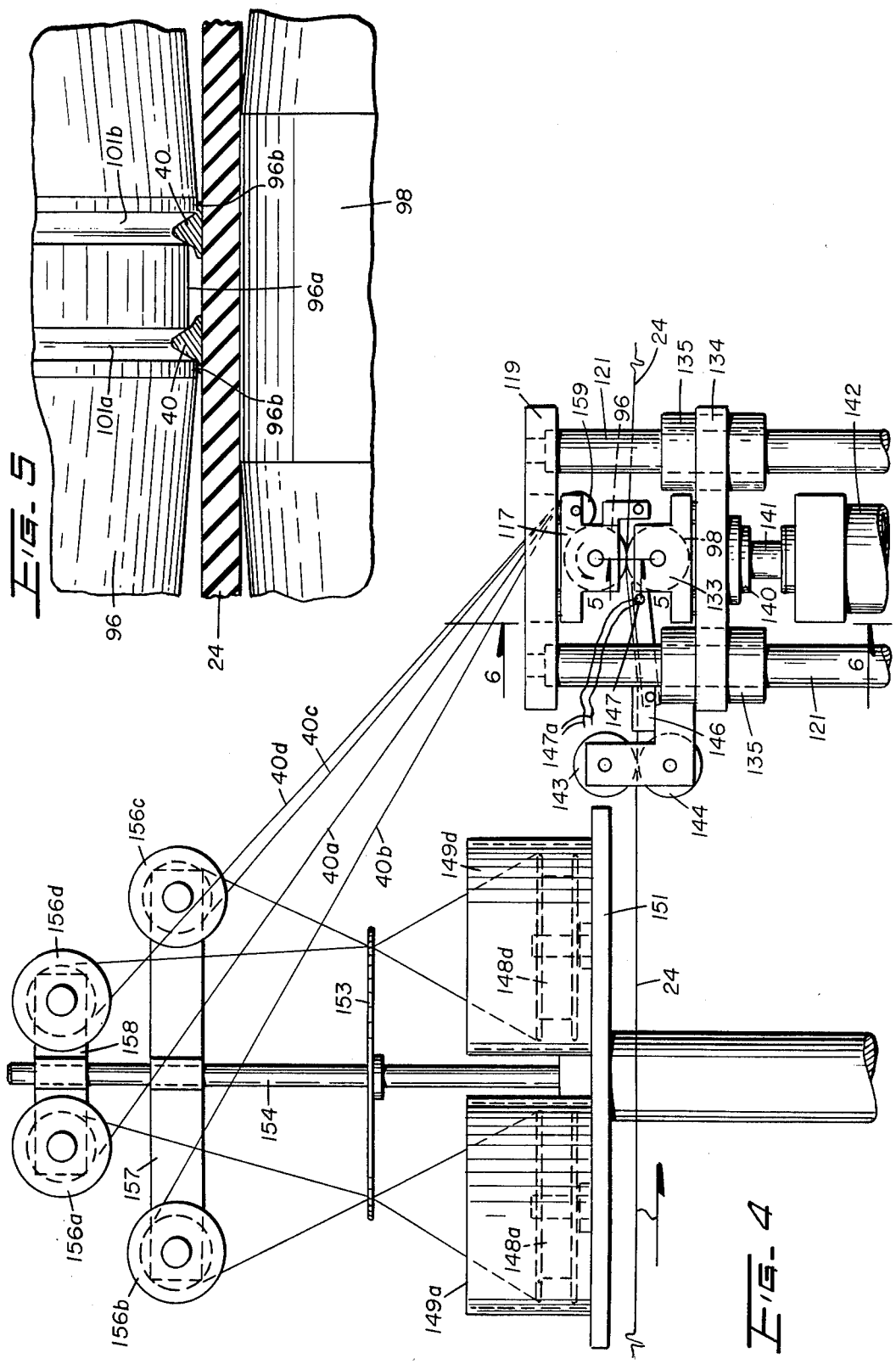

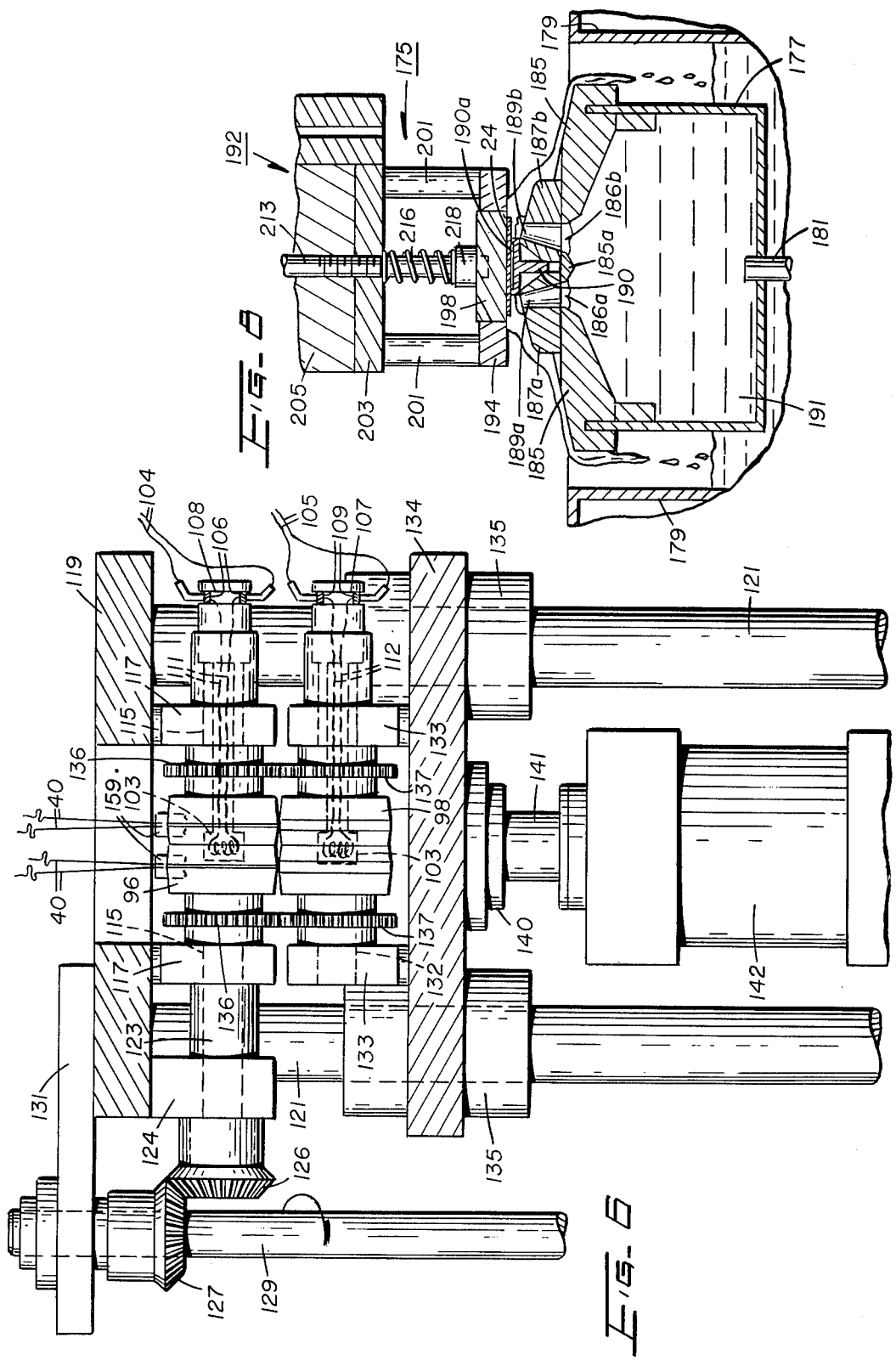

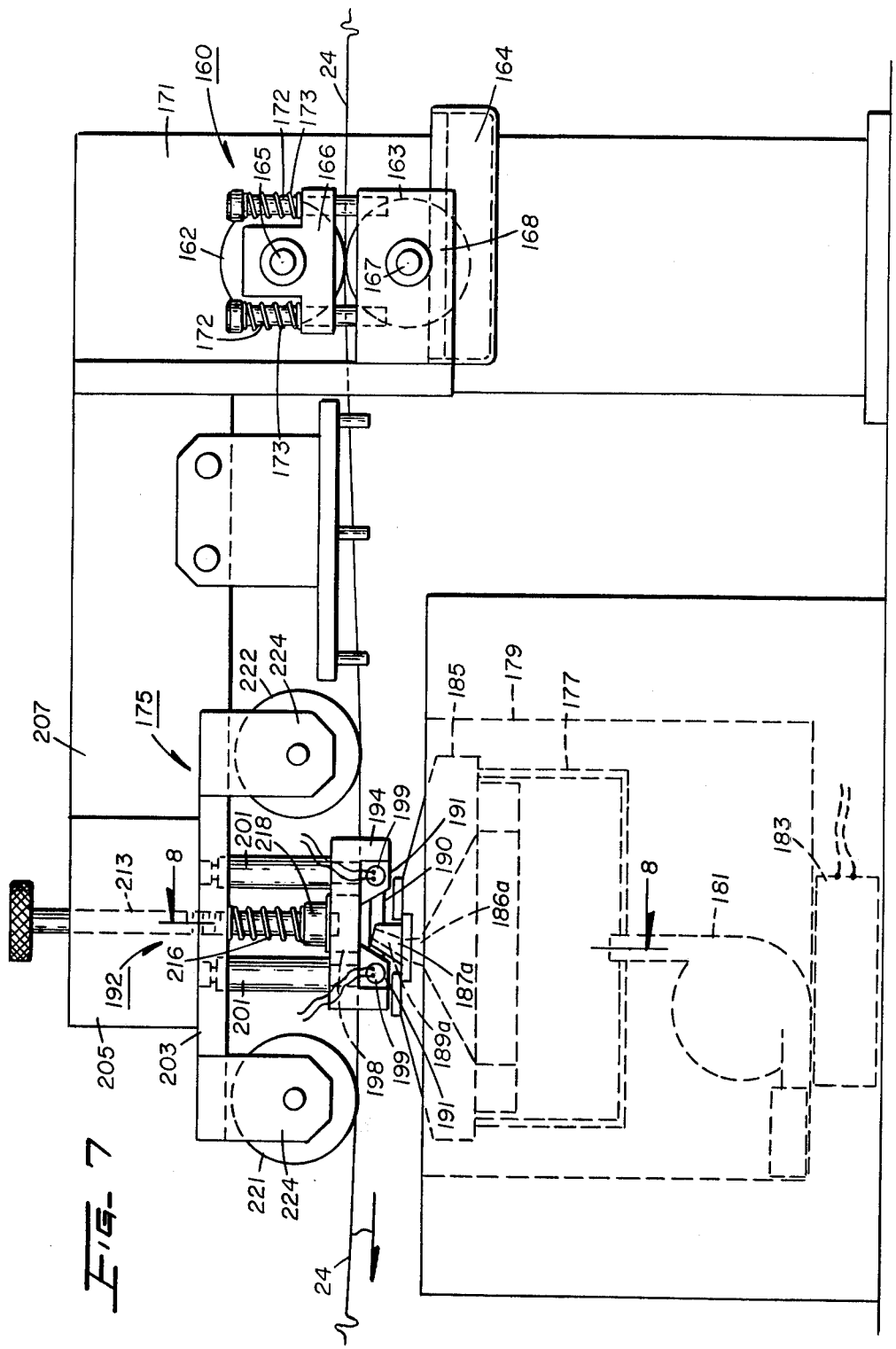

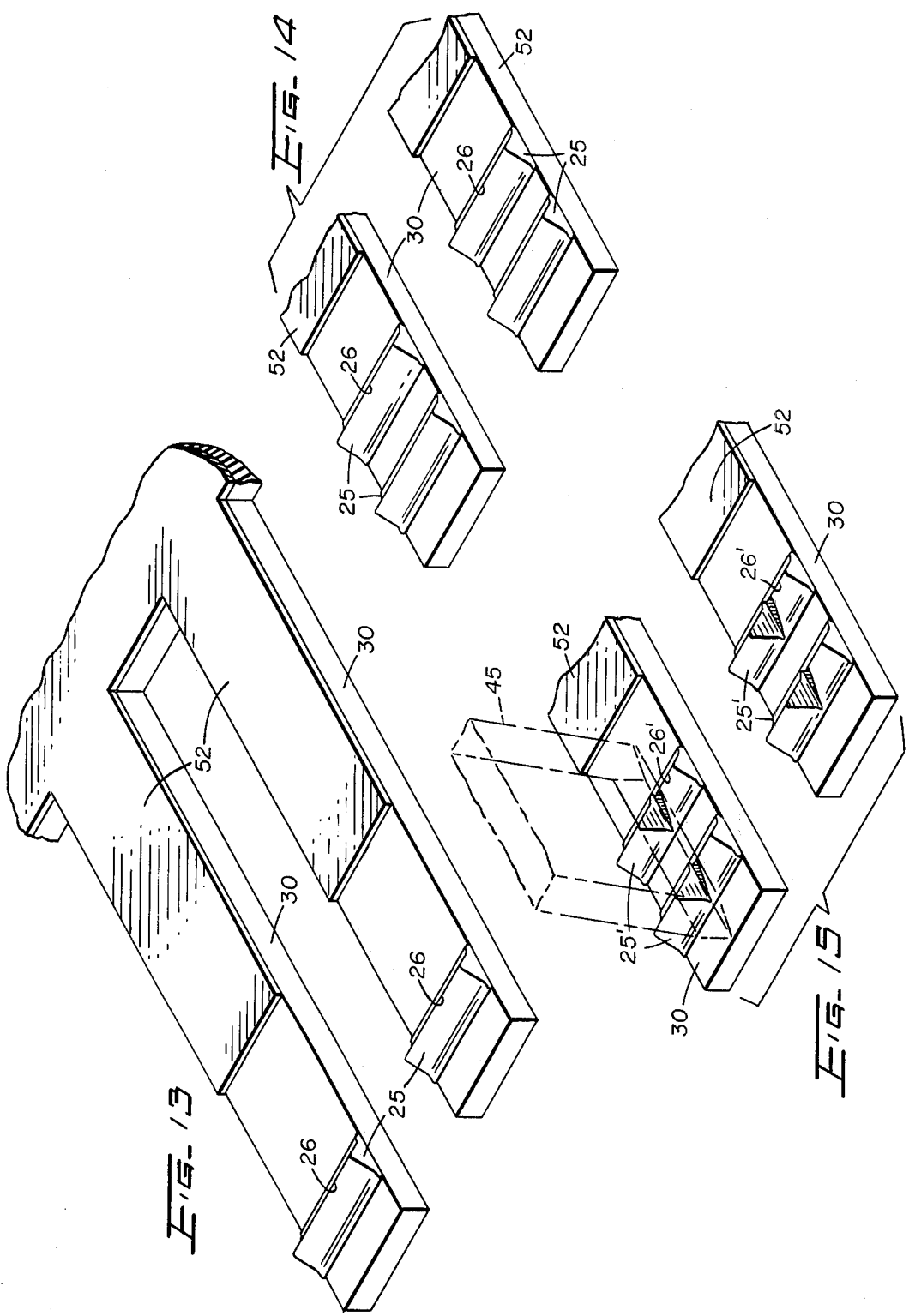

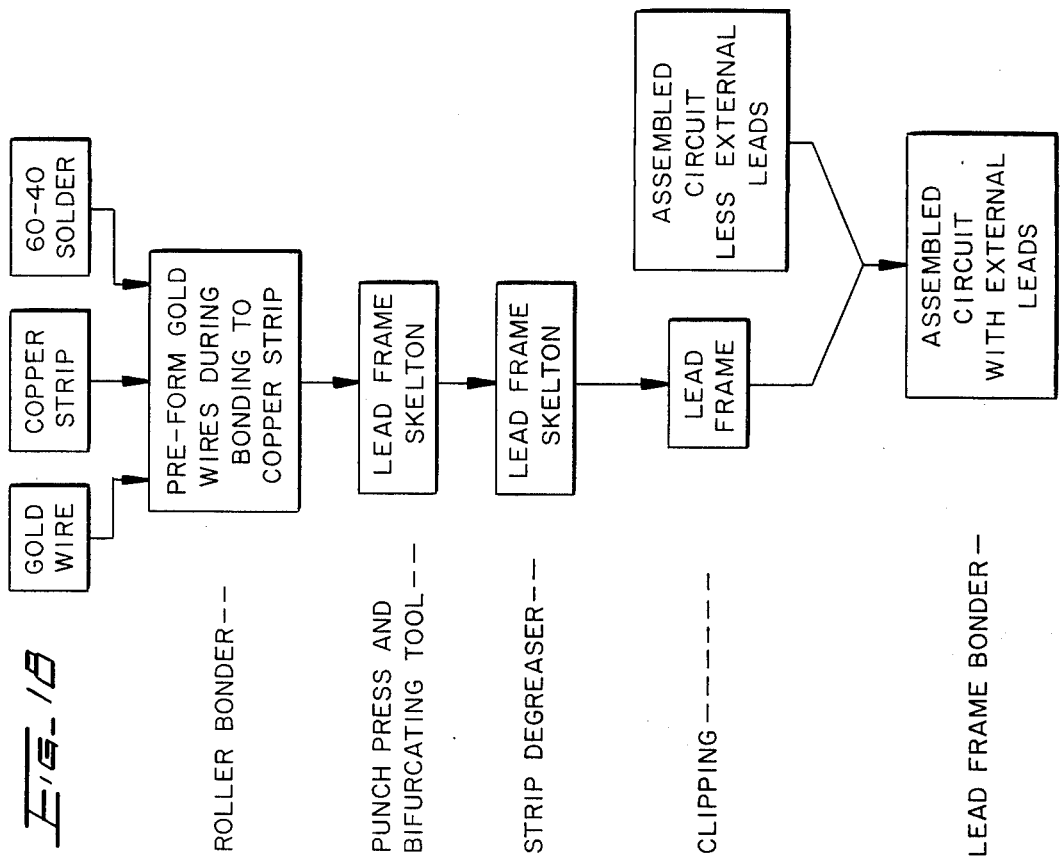
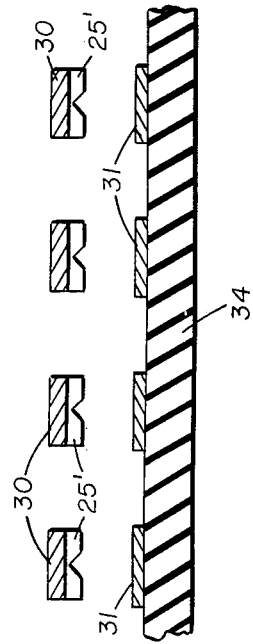
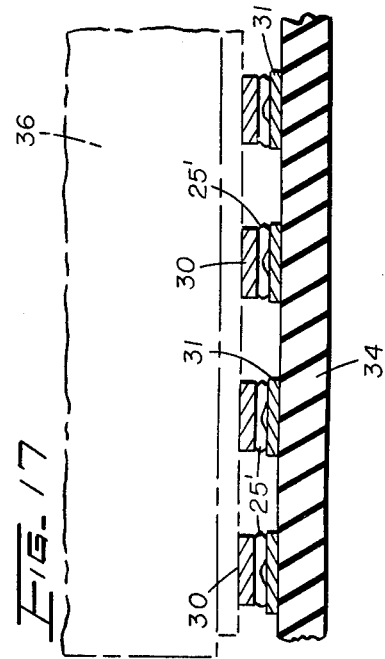

METHODS OF SOLID-PHASE BONDING MATING MEMBERS THROUGH AN INTERPOSED PRE-SHAPED COMPLIANT MEDIUM

This is a division of application Ser. No. 294,755, filed Oct. 3, 1972, now U.S. Pat. No. 3,834,604.

BACKGROUND OF THE INVENTION

1. Field of the Invention

This invention relates to solid-phase bonding and, more particularly, to the bonding of a first member, such as an external lead, to a second member, such as a thin film terminal, through the utilization of an interposed, specially contoured, compliant medium.

2. Description of the Prior Art

The advent of microminiaturization in the field of electronics and, particularly, the revolutionary changes that have taken place in the design of active and passive solid-state electronic components and circuits, utilizing both integrated and thin film technologies, have presented many serious and peculiar problems with respect to their fabrication and packaging.

The most striking property of integrated and thin film circuits, of course, is their microscopic size. Electrical components prevalent a decade ago, such as transistors and other discrete components, were readily seen and capable of being manually manipulated. Today, such components have been transformed into solid-state circuit elements of almost microscopic size, and often invisible to the unaided eye.

With respect to the packaging of solid-state circuits, the problems encountered are not only related to the minute size of the external leads that must be bonded to the circuits, so as to provide the necessary interconnecting link with associated equipment, but in the number of leads often associated with a given solid-state electronic circuit. The need for a plurality of external leads becomes readily apparent when it is realized that individual integrated circuit chips, often measuring less than a tenth of an inch on a side, may contain many active and passive circuit elements.

Accordingly, while the joining of one or more wires or leads 50 to 100 mils in diameter to mating terminals or pads of comparable size was common with discrete components a decade ago, today the joining of a large number of external leads, often less than ten mils in diameter, or width, to respectively associated thin metallic film terminals or pads is typical in the packaging of solid-state circuits. In such lead packaging, a glass or ceramic substrate is generally employed not only to support the active integrated circuit chips, but to expand the center-to-center spacings of the internal chip leads so as to allow external connections to be made to the outside world. The advent of beam lead sealed junction technology made external lead spacing expansion mandatory, as beam lead center-to-center spacings in the order of 1 to 3 mils has become commonplace.

In manufacture, the external leads may be attached to the branched out thin film paths, terminating in conductive connection areas, either prior to or after the bonding of the beam lead chip(s) to the supporting substrate. While the thin film connection areas are often interchangeably referred to in the art as contacts, lands, pads and terminals, the latter descriptive word will be generally used hereinafter in the interest of consistency.

Primarily due to the micro-size and two-dimensional nature of thin film terminals formed on the supporting substrate, normally by an evaporation process, such terminals are not effective in dissipating energy. Accordingly, during any joining process, not only the mechanical, but thermal energies imparted to the terminals will, in actuality, be transmitted directly to the substrate material. A concomitant problem in making reliable connections to thin film terminals is that the extremely small volume thereof places stringent limitations on the degree of abrasive action, dissolution and/or evaporation that can be tolerated during the metal joining operation.

For the foregoing reasons, it became quite apparent that a very significant and critical factor involved in achieving thin film connection quality, or integrity, is the effect on both the thin film and substrate of the energies imparted thereto by a given joining process. It was such a recognition that led to the conclusion at an early date that conventional bonding (including both soldering and brazing) techniques would generally not prove attractive and, in most cases, even feasible in making lead connections to thin film terminals. Moreover, the use of a low strength joining material, such as soft solder, and an increase in the areas to be joined in order to achieve high overall strength, for example, is inconsistent with the object of achieving a reliable micro-bond or weld zone consistent with high density electronic circuitry. The utilization of conventional solder to bond external leads to thin films, particularly on glass, can also often lead to what is referred to as substrate crazing, caused by solder induced thermal stresses in the substrate.

Fusion welding is another technique attempted heretofore to attach external leads to thin film terminals, but with limited success because of the minute thickness dimensions of the normally evaporated layers forming such terminals. Lasers, electron beams and resistance welders are other heat sources most often used in fusion welding.

In view of the foregoing deficiencies of alloy and fusion bonding (or welding) processes with respect to the assembly and lead packaging of solid-state circuits, in particular, attention was therefore concentrated on other types of joining processes that would not adversely affect the interface physical properties, while at the same time insure reliable lead-terminal adhesion qualities. Such concerted efforts lead to the use of solid-phase bonding which, as the name implies, is normally performed in the absence of any gross melting during bond formation.

The most common forms of solid-phase bonding are categorized broadly as thermocompression and ultrasonic bonding. A solid-phase bond is normally formed by inducing material flow in one or both members to be bonded by the application of heat and/or pressure so that adhesion takes place in the absence of a liquid phase, as in alloy or fusion bonding.

In connection with the external lead packaging of solid-state circuits, solid-phase bonding, particularly when used in conjunction with lead frames, advantageously makes possible low cost, multiple and reliable lead-terminal bonding on an automated basis. The utilization of a lead frame, of course, greatly facilitates the feeding, positioning and aligning of one or more arrays (or sets) of micro-size leads in overlying or underlying relationship relative to the associated thin film terminals on the circuit substrate.

In applications where there are multiple, micro-size lead frame leads and terminals to be solid-phase bonded, either thermocompression or ultrasonic wedge bonding is generally preferred. Such bonding processes normally require very close control over the pressure applied to the mating members, as well as over the heat applied in the case of thermocompression bonding. These parameters are of particular importance when the terminals comprise thin film layers deposited on a glass substrate.

More specifically, as is well known to those active in the manufacture of solid-state circuitry, variations in the flatness of the substrate, whether of glass, ceramic or any other material, may readily vary by as much as 100 microns. Such surface irregularities unfortunately seem to exist regardless of the care taken in polishing or otherwise finishing the bonding surfaces of the substrate. Similar surface irregularities, of course, occur in the evaporated thin films and in the mating surfaces of the leads. As such, these various mating surface imperfections often produce a very serious, cumulative error with respect to parallelism between the multiple bonding wedge tip and the top surfaces of the leads intended to be engaged thereby. This, in turn, can readily produce a considerable variation in spacing between the bonding wedge tip and the aligned leads.

It thus becomes readily apparent that as the number of leads to be bonded is increased, the total force imparted to the common bonding wedge will necessarily increase proportionally. Accordingly, a very detrimental concentration of pressure may often be created at one or more lead-terminal bond sites, leading to actual fracture or cracking of the substrate.

To compensate for and/or to minimize the establishment of such concentrated forces on the substrate, a technique of so-called compliant bonding in one form or another has been employed heretofore. In compliant bonding the substrate is normally mounted on a compliant supporting base which may comprise, for example, a resilient compensating pad, such as of rubber positioned beneath the substrate. A modification of such an arrangement has been the use of a plurality of spaced steel pins interposed between the resilient compensating pad and the underside of the substrate. Various pivotal and sometimes resiliently supported ball type mounts have also been employed heretofore as a compensating and compliant substrate base support.

While such prior compliant bonding techniques have proven to be quite successful with respect to effecting reliable thermocompression or ultrasonic bonds on relatively thick ceramic substrates, such techniques have not always proven to be satisfactory in the bonding of micro-size leads to thin film terminals on many glass and thin ceramic substrates. The reasons for this appear to be multi-faceted.

More specifically, solid-phase thermocompression or ultrasonic bonding is achieved by inducing an appreciable amount of material flow, or plastic deformation, in one or both members to be bonded during the application of pressure (as well as heat in TC bonding), so that effective dispersion of interface contaminants and member-to-member adhesion takes place in the absence of a liquid phase. With respect to plastic deformation, however, the plastic behavior of metals, in particular, is determined not only by external parameters such as temperature and pressure, but by material properties such as crystal structure, purity and microstructure. For these reasons, coupled with the fact that even the most carefully prepared mating bonding surfaces inherently are rough with respect to microscopic standards, it is not surprising that intimate micro-size lead-terminal contact normally takes place at only one or several microscopic bonding sites and, even then many times with deleterious pressure contact, often resulting in substrate fracture.

In addition to the aforementioned factors and problems affecting the integrity of solid-phase bonds, another serious problem encountered heretofore in the bonding of external leads to thin film terminals on glass substrates relates to a phenomenon known as glass cavitation. Such cavitations develop randomly and immediately beneath certain thin film terminals, normally evaporated on the glass substrate, and may best be described as minute, surface glass nuggets which physically separate from the parent substrate material. Such defects appear to result selectively, as well as collectively, from such interrelated factors as insufficient bond compliancy, excessive bonding forces, and insufficient bond definition (interface surface area).

Unfortunately, such glass cavitations almost always result in bonds exhibiting very low or zero pull strength. The serious nature of this condition is compounded by the fact that most of such affected thin film terminals are usually destroyed, making it impractical to repair the almost completely fabricated solid-state circuit. With such circuits often being very complex and quite costly, selective terminal damage due to glass cavitation, as well as substrate fracture due to excessive bonding pressures, constitute particularly costly defects in the manufacture of solid-state devices and circuits.

It is thus seen that conventional thermocompression and ultrasonic bonding of micro-size leads directly to thin film terminals formed on glass substrates has frequently and selectively led to one of the following deleterious conditions: (1) non-uniform bond strengths, (2) substrate fracture, and (3) cavitation of the glass under selective thin film terminals. Extensive investigation led to the conclusion that the three above listed problems are unfortunately interrelated. More specifically, the strength of thermocompression produced bonds could generally be improved by increasing the temperature of the bonding tip, and/or the force applied during bonding, and/or the length of the bonding cycle. Unfortunately, however, varying any of these parameters appreciably from nominal values invariably results selectively, or collectively, in an unsatisfactory degree of bond integrity, glass cavitation and substrate fracture.

Accordingly, there has been an urgent need to modify conventional solid-phase bonding techniques so as to minimize, and hopefully completely eliminate, the aforementioned interrelated bonding problems, particularly with respect to glass substrates. This has led to the utilization heretofore of an interposed contact, such as of gold, between each mating lead and terminal. There have been a number of techniques proposed and/or used heretofore to respectively position such supplemental interposed contacts between mating leads and terminals. One such technique has involved the individual bonding of a micro-size gold contact, e.g., in the form of a disc, on the mating surface of each lead. This has proven to be a very time consuming and costly procedure on a mass production basis and, in addition, because of the contact geometry, does not provide an appreciable amount of resiliency or compliancy without an excessive amount of bonding pressure being employed.

Another technique employed to form an interposed bonding contact heretofore has involved the electrodepositing of a thin gold stripe across the terminating end region of each lead. In the case of lead frames, such a stripe may be formed either before or after the blanking operation. For reasons pointed out in greater detail hereinafter, such a technique has the disadvantage that the electrodeposited stripe cannot be readily and inexpensively formed with the thickness and peculiar cross-sectional configuration necessary to attain consistent, high quality bonds, i.e., bonds exhibiting the requisite solid-phase bond interface properties.

A superficially similar, but non-related technique for forming precious metal contacts on lead frame leads has been employed in the manufacture of electro-mechanical relays. In such an application, the contacts have been attached by resistance (fusion) welding of pre-formed precious metal wires or tapes to relatively thick strip stock, with the leads subsequently being blanked out of the processed strip stock. Such a fusion joining process, however, is normally not applicable for use with strip stock having thicknesses on the order of 1 to 5 mils. Moreover, such wires or tapes do not require any peculiar shaping during welding either for achieving reliable adhesion to the strip stock, as a liquid-phase type of bond is relied upon, or even more importantly, for achieving inherent compliancy, because such pre-formed welded wire or tape segment-contacts are not used as an interposed compliant bonding medium.

Rather, such welded contacts are simply used to insure reliable, non-corrosive, long wearing, periodic relay-actuated contact with a mating member. It thus becomes readily apparent that neither such a lead frame fabrication technique, nor the contacts produced therewith, are of interest with respect to the problems of achieving reliable solid-phase (as distinguished from liquid-phase) bond integrity, while simultaneously eliminating substrate failures in the lead packaging of micro-size solid-state devices or circuits.

Accordingly, in addition to the inadequacies of previous interposed contacts per se, particularly with respect to being shaped to exhibit substantial inherent interface bonding compliancy, such as between a lead and thin film terminal, there has been a need for apparatus to bond and geometrically shape an interposed bonding medium into an inherent compliant contact either during or after attachment, preferably to the leads, in an efficient, reliable, and automated manner. A contact shaping operation, of course, is needed not only to produce an effective compliant contact, but in the case of solid-phase bonded contacts to effect an improvement in both the mechanical cleaning of, and lead-terminal adhesion at both the lead-contact and contact-terminal bond interfaces. This is particularly important when thin film terminals are involved as they are not amenable to directly induced cold flow.

Notwithstanding the need for and the benefits that can be derived from the use of a specially shaped and interposed compliant bonding contact per se, the problem alluded to hereinabove, pertaining to random surface micro-imperfections, particularly in glass substrates, may in very demanding bonding applications, necessitate still additional precautionary measures to be taken in order to insure reliable and constant bond integrity.

More specifically, there has also been a need for the use of not only one initially formed bond, but at least two or more distinct and separate bonds between a lead and terminal, for example, so as to produce what may be referred to as a redundant type of bond therebetween. A redundant bond, as defined herein, consists of forming two or more distinct and separate bonds between two members, with a distinct area between such members being left unbonded, and with a minimum center-to-center spacing being provided between adjacent bonds for reasons described in greater detail hereinafter. Through the utilization of such redundant bonding, investigation has proven that it is statistically improbable that a high quality solid-phase bond will not be produced from at least one of the contact-established bonding sites. Moreover, it is equally statistically improbable, with sufficient compliancy established through multiple interposed contacts, for the aforementioned glass cavitations to develop immediately beneath two or more bonding sites on, or for a fracture to develop in, a glass substrate.

Redundant bonds may also prove to be very important in certain applications because of microscopic substrate surface blemishes caused, for example, by a foreign contaminant or particle that prevents complete thin film adherence to the substrate. When this happens, the defective portion of the terminal may very readily break off from the remainder of the terminal at a single lead-contact-terminal interface. A corollary to this problem, of course, is the possibility that a microscopic surface blemish may similarly occur between a given compliant contact and the lead to which it is mutually bonded. Accordingly, the use of more than one compliant contact per lead to produce redundant bonds can very effectively minimize, if not eliminate, lead-terminal bond failures.

Micro-gap or parallel gap thermocompression bonding, of course, produces a form of redundant bonding. However, such bonding processes do not allow flexible control over the spacings between the electrodes, nor are they conducive to multiple bonding applications utilizing a common heated bonding tool. Parallel gap bonding also does not require, nor has it been utilized, or suggested for use, heretofore, in combination with multiple interposed contacts, whether pre-shaped or not, in order to resolve the aforementioned solid-phase bonding problems and, thereby, achieve the desired end results urgently sought in the art heretofore.

Summary of the Invention

It, therefore, is an object of the present invention to provide very effective and reliable processes for producing consistently uniform and high quality solid-phase bonds between two mating members, through the utilization of at least one interposed, pre-shaped medium that not only functions as an inherent compliant contact, but produces the degree of material flow required to attain mechanical cleaning and reliable bond adhesion at the interface, and insure predictable control over bond definition.

It is another object of the present invention to improve bond quality, minimize substrate fracture and cavitation defects when the substrate is of glass, during the solid-phase, redundant bonding of microscopic-size leads to thin film terminals, through the utilization of at least two specially configured compliant contacts interposed between each lead and terminal in the mating bond area.

It is still another object of the present invention to produce multiple, solid-phase redundant bonds between micro-size leads and thin films formed on substrates, such as of glass or ceramic, through the utilization of a specially fabricated lead frame that incorporates two or more closely spaced and specially shaped compliant contacts secured to the terminating ends of each of a plurality of lead frame leads on an automated basis, and wherein both the number and the geometry of the contacts on each lead may be readily chosen to produce a sufficient degree of inherent compliancy, material cold working and controlled bond definition at the bond interfaces, to insure the attainment, for a given application, of consistent, high quality bonds, while simultaneously obviating problems with respect to substrate surface micro-imperfections, and bonding force-induced substrate fracture and glass cavitation.

In accordance with the principles of the present invention, as related broadly to the solid-phase bonding of two mating members, an interposed medium in the form of a specially shaped precious metal contact, for example, is initially secured to the mating surface of one of the members. When the mating members comprise a micro-size lead and a thin film metallic terminal, for example, the interposed contact preferably comprises a gold wire segment that is initially thermocompression bonded to a terminating end region of the lead. The contact may be pre-shaped either during the bonding operation or thereafter, so as to have a contour that is preferably either triangular or fillet-shaped, with a pronounced raised central crest region.

Such an interposed bonding medium or contact has advantageously been found to provide a degree of inherent or built-in compliancy that in most cases obviates the need for any auxiliary and external compliant fixturing, such as conventionally built into the base and/or the ram of the bonding apparatus.

In addition, the triangular or fillet-shaped complaint contacts result in considerably more plastic deformation taking place at each bond interface than would otherwise be possible with either no interposed compliant medium, or a medium that was not pre-shaped in the manner described herein. The resulting wiping action, or tangential material flow, that takes place initially between the contact and lead, and then between the contact and terminal interfaces, has been found to substantially break-up and disperse any surface contaminants, and improve both bond definition and lead-terminal bond strength.

Concomitantly, the combination of redundant bonding and inherent compliancy made possible by multiple, peculiarly shaped interposed contacts, has substantially eliminated substrate failure. As such, the present invention has resulted in multiple bond yield rates never achieved with other techniques heretofore.

In accordance with a preferred method for use in the multiple solid-phase bonding of a plurality of micro-size external leads to associated thin film terminals formed on a supporting glass, ceramic or other similar substrate, a lead frame is initially fabricated out of strip stock, such as of copper or nickel. After initially cleaning the surface of the strip stock, either chemically or mechanically, or both, the cleaned but unblanked strip stock is passed through a pair of heated and resiliently biased thermocompression bonding rollers, together with one or more fine gauge gold wires having a diameter in the range of 0.003 –0.01 inches, for example. The bonding rollers are advantageously formed with specially contoured grooves so as to pre-shape the gold wires into the aforementioned desired cross-sectional geometry, namely triangular or fillet-shaped, while simultaneously being bonded to the moving strip stock.

At least one gold wire is thermocompression roll bonded to the strip stock along each longitudinally extending region thereof which will coincide with the common terminating end regions of each array (or set) of lead frame leads formed during a subsequent strip stock blanking operation. The utilization of roller-type thermodes to bond the gold wire(s) to the strip stock affords several unique advantages (1) the grooves thereof can be readily machined to pre-shaped each gold wire into any one of a number of desired cross-sectional configurations, (2) the inherent nature of roll bonding induces controllable plastic deformation (material cold flow) in directions both normal and tangential to the bond interface, as required for effective mechanical cleaning and reliable bond adhesion at the copper-gold interface, and (3) the thickness and spacing of the compliant contacts may be precisely controlled without the need of elaborate and costly masks or duplicated operations, e.g., as used in producing plated build-ups to the requisite thickness.

In many applications requiring solid-phase bonding of external lead frame leads to thin films on glass substrates, it is very advantageous to bond initially two (or more) closely spaced gold contact-forming wires to the lead frame-forming strip stock for each array or set of leads. As such, when the partially fabricated strip stock is subsequently blanked out to form the lead frames, there will be two (or more) pre-shaped and closely spaced compliant gold contacts for each lead. This advantageously allows redundant bonds to be made between each lead and mating terminal, with considerable inherent compliancy being established at the bond interfaces.

For best bonding results, as will be described in greater detail hereinafter, extensive investigation has determined that there must be a distinct correlation between the total surface area encompassed by the multiple redundant bonds produced between each mating lead and terminal, and the center-to-center spacing between adjacent bonds, in order to achieve high quality bonds with no substrate failures.

In accordance with still another aspect of the invention, the very advantageous attributes of redundant bonding with inherent compliancy may be effected by using not only multiple pre-shaped compliant contacts bonded to each lead initially, but also by using a single bonded compliant contact per lead, with each bonded contact thereafter being swaged or bifurcated into two closely spaced compliant contacts of approximately half of the original size.

With respect to very fragile glass substrates and extremely small external leads, it has been found very advantageous to initially bond two of the aforementioned compliant contacts to each external lead, with each of these dual contacts thereafter being bifurcated so as to effectively form four smaller bonded compliant contacts in essentially space quadrature. With such multiple compliant contacts, it has been found in one particularly critical multiple lead bonding application, that both substrate and bond failures have been reduced to less than one percent. This exceptionally low failure rate has never even been approached before utilizing conventional solid-phase bonding techniques and processes.

BRIEF DESCRIPTION OF THE DRAWINGS

FIG. 2 is a simplified side elevational view, partly symbolic, of the composite apparatus depicted in FIG. 1;

FIG. 3 is an enlarged, cross-sectional view of the water rinse tank adjacent the bonding station depicted in FIG. 2.

FIG. 4 is an enlarged, partial side elevational view illustrating in greater detail features of the contact wire feeding and thermocompression roll bonding apparatus;

FIG. 5 is an enlarged, fragmentary view, taken partially in section along the line 5—5 in FIG. 4, illustrating in greater detail the peculiar geometry of the bonding roller grooves for both pre-shaping and effecting the thermocompression bonding of compliant gold contact wires to the surface of a moving and coextensive lead frame-forming copper strip, in accordance with the principles of the present invention;

FIG. 6 is an enlarged, front elevational view illustrating in greater detail the manner in which the bonding rollers are mounted, biased, driven and heated;

FIG. 7 is an enlarged, side elevational view illustrating in greater detail the fluxing and solder coating apparatus wherein precisely defined narrow solder coated stripes are formed along the edges on one side of the strip stock as it is continuously fed therethrough;

FIG. 8 is an enlarged, fragmentary view, taken partially in section along the line 8—8 in FIG. 7, illustrating in greater detail the manner in which molten solder is applied to the strip stock;

FIG. 13 is an enlarged, perspective fragmentary detail view of two lead frame leads of the type depicted in FIG. 11, with only one pre-shaped gold compliant contact bonded to each lead in accordance with the principles of the present invention;

FIG. 14 is an enlarged, perspective fragmentary detail view of two lead frame leads similar to those depicted in FIG. 13, with the exception that there are two pre-shaped gold compliant contacts bonded to each lead so as to facilitate the redundant bonding of each lead to a mating terminal in accordance with the principles of the present invention;

FIG. 15 is an enlarged, perspective fragmentary detail view of two lead frame leads initially fabricated with two pre-shaped compliant contacts bonded thereon, as depicted in FIG. 14, but with each contact thereafter being bifurcated so as to form four smaller compliant contacts in space quadrature in accordance with the principles of the present invention;

FIGS. 16 and 17 are enlarged, fragmentary cross-sectional views illustrating, in sequence, the relationship between a plurality of respectively aligned leads, each having a plurality of compliant, bifurcated contacts secured thereto, and thin film terminals, both before and after the leads have been bonded to the associated thin film terminals, and FIG. 18 is a flow chart illustrating the sequence of operating steps involved in fabricating a miniaturized lead frame in a manner which facilitates the multiple, thermocompression redundant bonding of the lead ends thereof, each having two or more pre-shaped compliant contacts secured thereto, to respectively aligned thin film terminals, in accordance with the principles of the present invention.

DETAILED DESCRIPTION

Figure 1:
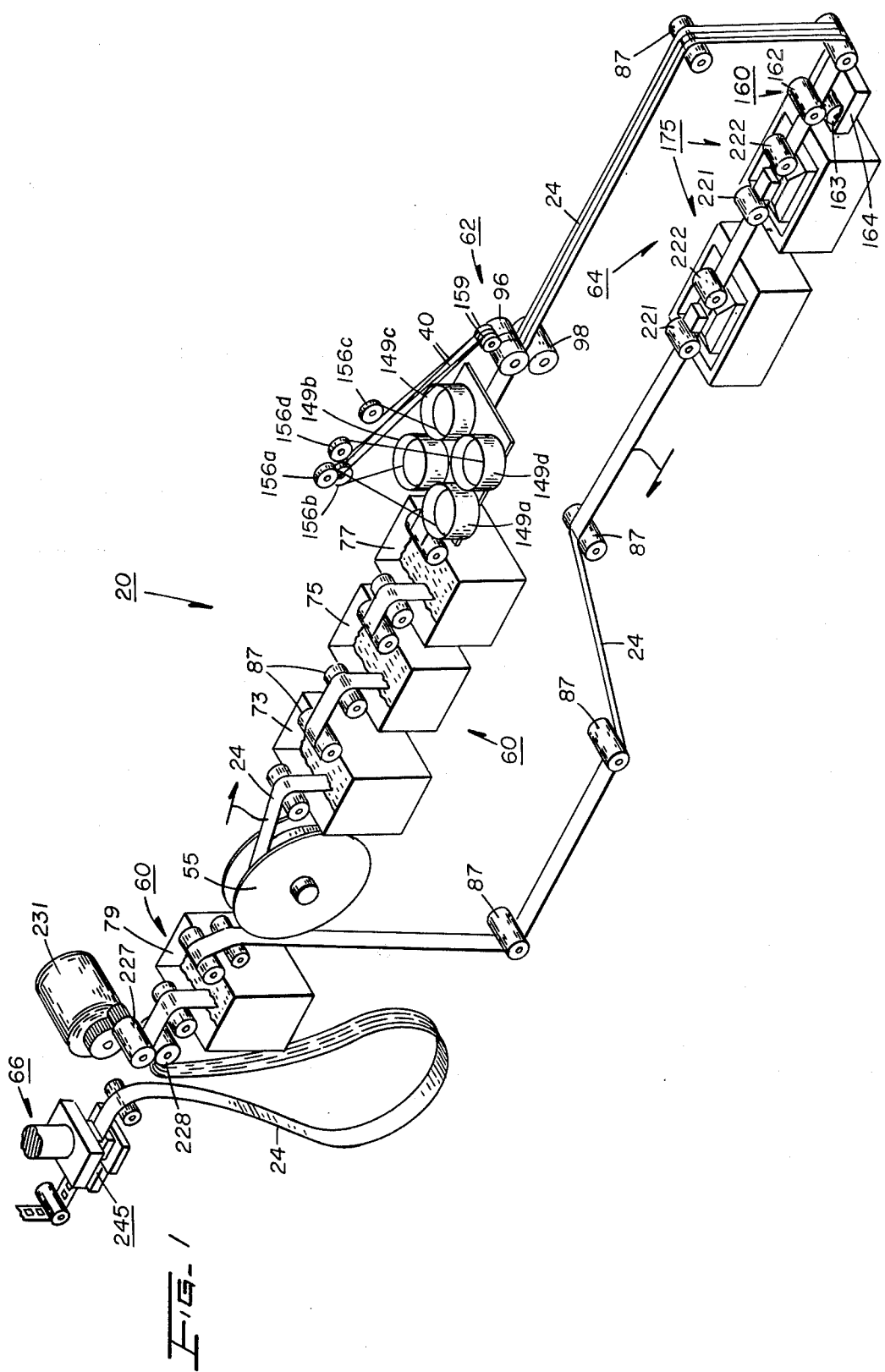
FIG. 1 is a perspective view of a thermocompression roll bonding and solder coating apparatus particularly adapted for use in the fabrication of miniaturized lead frames employed in the lead packaging of thin film and integrated circuits, in accordance with the principles of the present invention.
Figure 11:
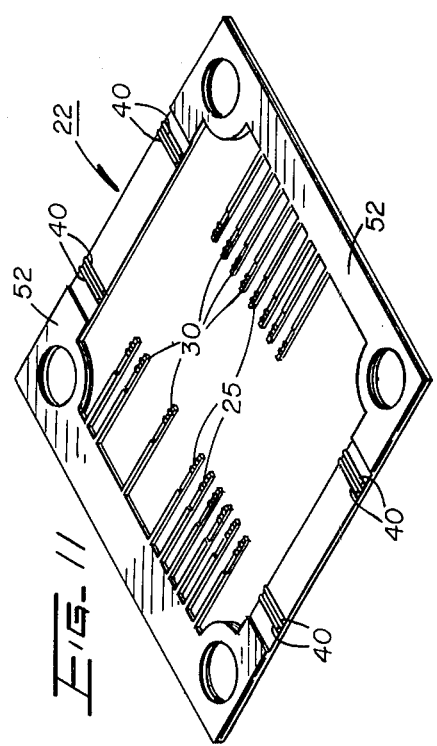
FIG. 11 is an enlarged perspective view of a typical lead frame after having been blanked out of the strip stock skeleton depicted in FIG. 10, ready for use in making external lead connections to a thin film electrical circuit.

In accordance with the principles of the present invention, methods and apparatus are embodied and claimed herein for producing preferably solid-phase thermocompression bonds between two mating members and, in particular, between micro-size leads and thin film terminals, through the utilization of at least one interposed, specially contoured interface-defining compliant medium or contact. In accordance with one preferred application of the invention, a unique thermocompression roll bonding and solder coating apparatus designated generally by the reference numeral 20, as best seen in FIGS. 1 and 2, is employed in the fabrication of miniaturized lead frames 22 (FIG. 11). These lead frames, with respect to one preferred embodiment, are fabricated in accordance with a sequence of operating steps set forth in the flow chart depicted in FIG. 18.

Figure 12:
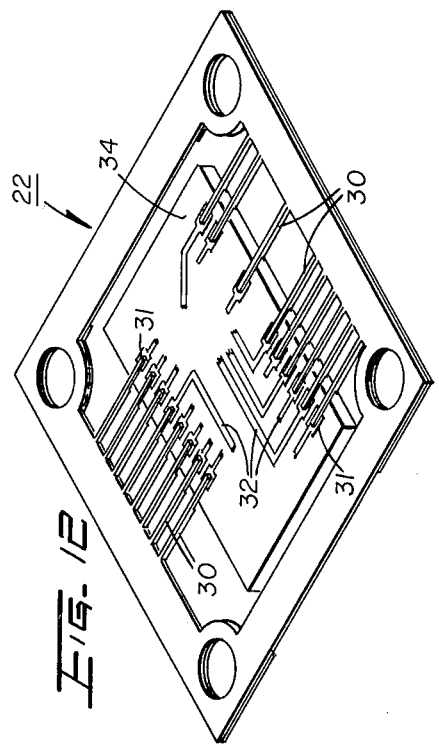
FIG. 12 is an enlarged perspective view of the lead frame depicted in FIG. 11, after the terminating lead ends thereof have been positioned in respective alignment with a plurality of thin film terminals on a circuit substrate.
Figure 9:
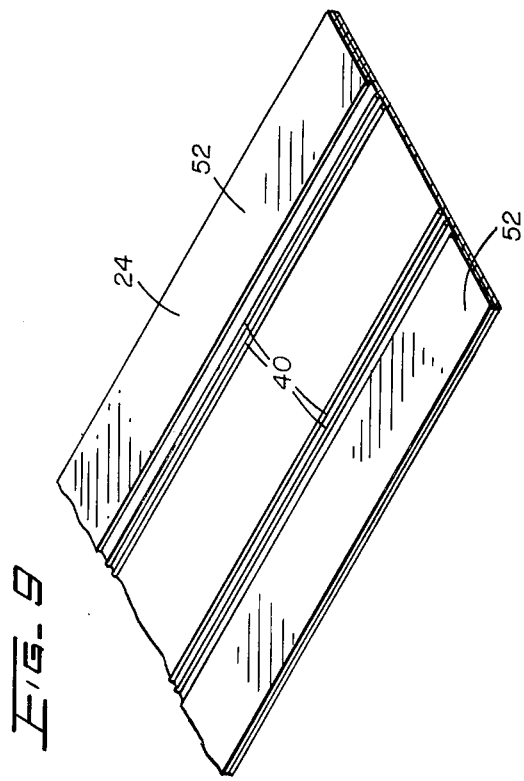
FIG. 9 is an enlarged, perspective fragmentary view of a partially fabricated and unblanked section of lead frame strip stock after four contact-forming gold wires in closely spaced pairs have been pre-shaped and thermocompression roll bonded thereto, and after a pair of narrow stripes of solder have been coated along the longitudinal edges on one side of the strip stock, in accordance with one preferred embodiment of the present invention.

It will suffice to simply state at this point, that the lead frames 22 embodied herein are initially fabricated out of wide flat strip stock 24, best seen in FIG. 9, and undergo a number of processing operations prior to being blanked, first into a lead frame-forming strip stock skeleton 24' with one or more compliant contacts 25 formed on the end of each lead 30 thereof (FIG. 10), and finally into individually blanked out lead frames 22 of the type depicted in FIG. 11. Such individual lead frames 22, comprising a base member having the leads 30 integral therewith and projecting therefrom in spaced relationship, are thereafter ready for positioning in suitable fixturing (not shown) adapted to precisely align the free ends of the plurality of leads 30 in respective overlying relationship with a plurality of thin film terminals 31, with the compliant contacts being interposed therebetween. The terminals may be associated, for example, with a solid-state circuit 32, only symbolically shown, supported on a substrate 34, such as of glass or ceramic, as depicted in FIG. 12. As thus aligned (see FIG. 16), multiple solid-phase bonds are preferably produced to complete lead-terminal-substrate interconnections as depicted in FIG. 17.

Considering now in greater detail the unique interposed compliant contacts 25, they are preferably composed of gold and are most advantageously formed initially on the mating surfaces of the leads 30, with a unique cross-sectional configuration best described as either essentially triangular or fillet-shaped, so as to have rather pronounced and well defined central crest regions 26, each of which is smaller in surface area at an outer or upper portion thereof than a base-interface of the contact with its lead 30 (see FIGS. 13–15). Such contact geometries, as previously mentioned, have been found to effect a substantial improvement in the attainment of consistently high quality lead-thin film terminal bonds, with a minimum, if any, of substrate fractures. The inherent compliancy of the contacts also obviates the need for auxiliary compliant fixturing built into the bonding apparatus itself.

As becomes readily apparent from an examination of FIGS. 13–15, the uniquely shaped and interposed compliant contacts 25 may be initially secured to the terminating end region of each lead 30 singly, or in plural combinations, such as in closely spaced pairs (FIG. 14), or in pairs with each compliant contact thereafter being swaged or bifurcated to form double pairs of contacts 25' having the raised compliant crest regions 26', in effect, in space quadrature, as depicted in FIG. 15.

The particular number of specially shaped compliant contacts 25 employed per lead will normally be dependent on the requirement of a particular bonding application. More specifically, if bonding is to take place on relatively thick ceramic, sapphire, spinel, or epoxy glass substrates, for example, the use of a single pre-shaped compliant contact per lead may prove more than adequate to produce the degree of compliant plastic deformation required at each bond interface to attain consistent bond integrity, while at the same time minimizing or obviating bonding pressure-induced substrate failures.

Appreciable plastic deformation (including tangential material flow) is very important, of course, in insuring not only that there will be adequate mechanical cleaning or dispersing of contaminants at the bond interfaces, but reliable bond definition, and related metal-to-metal adhesion. Bond definition as used herein relates to the surface area of each bond interface, and when consistently formed with appreciable plastic deformation, produced with relatively low bonding temperatures and/or pressures, contributes to the attainment of bonds exhibiting maximum adhesion characteristics. As is clearly shown in FIGS. 15–17, in the case of one of the contacts 25' and its associated terminal 31, this involves depressing (or flattening) and tangential cold-flowing of the contact so as to produce an interface of enlarged cross-sectional area as compared to the initial surface area of the small outer or upper portion of the contact crest region 26'.

In applications where the leads are of microscopic size, and the terminals comprise very thin, evaporated metallic films deposited on fragile glass substrates, for example, two or more compliant contacts of the type embodied herein may often prove necessary in order to obtain consistent solid-phase bonds of high quality. As previously pointed out, the use of multiple contacts per lead produce redundant bonds which, as defined herein, consist of forming two or more distinct and separate bonds between a lead and mating terminal, for example, with a center-to-center spacing between adjacent bonds preferably being no less than twice the width of a single bond, thus defining an appreciable unbonded area therebetween.

The significance of such minimum bond site spacings per connection is that glass cavitation areas and surface micro-imperfections randomly occur on the surface of any substrate. Similarly, on rare occasions as previously mentioned, it can happen that the substrate and/or strip stock bonding surface(s), even after having been thoroughly cleaned chemically, may still have microscopic surface blemishes thereon caused, for example, by a foreign contaminant or particle. Such random microscopic surface contamination need not come from the surrounding atmosphere, as is typically the case, but could result, for example, from any residue or globules of the various cleaning solutions, including rinse water, that have not been completely removed from the particular bonding surface involved. When such surface blemishes do occur a defective lead-terminal bond may more readily occur, of course, when a single interposed compliant contact is employed. It therefore follows that if the two or more compliant contacts employed for redundant bonding are spaced an appreciable distance apart, that it would be statistically improbable for two or more cavitations, or two or more micro-imperfections, or two or more microscopic contamination areas, to occur under the same corresponding number of multiple bonding sites. This definitely has proved to be the case for minimum spacings of the order described, after extensive investigation. The degree of inherent compliancy and plastic deformation that can be realized in any given bonding application, of course, also advantageously increases proportionally with the number of similarly dimensioned contacts employed.

It is thus seen that the final choice on the number of interposed compliant contacts required will depend on many factors, such as the nature of the materials employed, the size of the mating surface areas, the volume of the materials being joined, and the rigidity of the supporting substrate, to mention but a few.

Through extensive investigation into various types of bonding and welding processes and techniques, it became very evident that a thermocompression roll bonding technique was ideally suited for fabricating lead frames with multiple pre-shaped compliant contacts of the types embodied herein. More specifically, roll bonding provides in one simplified, inexpensive and automated operation, very reliable and strong copper strip stock-to-gold-wire contact adhesion characteristics, due primarily to appreciable (and readily controlled) tangential, as well as normal, pressure-imparted plastic deformation (or coldworking) of the gold at the metal-to-metal interface. Simultaneously therewith, roll bonding provides precise control over the peculiar shaping of contact forming gold wire(s) 40 (see FIG. 4), in particular, during the bonding operation.

Such a solid-phase bonding process, together with the apparatus embodied herein for practicing it, also readily facilitates the forming of any number of closely spaced and specially contoured compliant contacts per lead. Moreover, the size and shape of the contacts may be readily controlled through the initial choice of wire diameter and/or degree of plastic deformation produced during bonding. By utilizing changeable bonding rollers with different groove geometries, the possible number of compliant contact sizes and/or profiles are virtually unlimited. The solid-phase roll bonding apparatus embodied herein has also been found to be equally effective in bonding and shaping other precious metals to copper, as well as in bonding precious metals to nickel or zinc strip stock, for example. Many other mating metal combinations may also be solid-phase roll bonded and shaped in accordance with the principles of the present invention, as long as at least the metal to be shaped is relatively ductile.

Attention will now be directed to one specific and very demanding lead fabricating and solid-state circuit bonding application, wherein a lead frame 22, of the type depicted in FIG. 11, is initially formed with four compliant contacts 25' on each lead 30, of the type depicted in FIG. 15, with the leads thereafter being bonded to thin film terminals 31 formed on a circuit substrate 34 of the type depicted in FIG. 17.

For this application, and by way of both illustration and background, a "Constant Load" bonder was employed. To simultaneously thermocompression bond the lead frame leads 30 to the thin film terminals 31, this bonder included two independently pivoted bonding wedges, one being shown symbolically in FIG. 17 by the reference number 36. Each bonding wedge was heated with a 200-watt cartridge heater. The bonding wedges were conventionally mounted on a 62 pound movable platen, adapted for retractable movement along four guide pins projecting from and supported on the base of the bonder. The temperature of each bonding wedge was independently controlled and could be varied from 300° to 800°C. For the particular bonding application described herein, bonding parameters ultimately chosen were 600°C for the bonding temperature and 0.8 seconds for the bonding time. Best results were also found with a bonding force held constant at approximately 4 pounds per lead-terminal connection.

With such a thermocompression bonder, and with no interposed and pre-shaped compliant contacts 25, it was found impossible to achieve consistent bond strengths, and to avoid considerable and costly failures due to substrate fracture and glass cavitation. More specifically, these three problems proved to be interrelated. Generally, bond strengths could be improved by increasing the temperature of the bonding tip, the force applied during bonding, and/or the length of the bonding cycle. Increasing these parameters appreciably above nominal values either singly or in selective combinations, however, almost invariably resulted in greater substrate failures.

Stated another way, if maximum bond strengths were desired, substrate cracks would inevitably develop or glass cavitations would be produced under certain of the thin film terminals at rates that were unacceptable. Accordingly, if substrate failures were to be minimized, there had to be a trade-off in bond strength. In other words, one or the other could be obtained by varying the three basic bonding parameters (time, pressure, and temperature), but not both. As such, it was only through the utilization of a unique lead frame 22, with multiple pre-shaped compliant contacts 25 formed thereon, that the aforementioned problems were finally resolved.

With respect to the compliant contact configurations depicted in FIGS. 13 to 15, the utilization of two compliant contacts 25 are often preferred, as previously pointed out, to produce redundant bonds. As for the use of more than two compliant contacts per lead, extensive investigation into possible reasons why reduced, but nevertheless costly bond failures and substrate fracture were still experienced with dual contacts, in certain applications, led to the conclusion that inasmuch as the strength of each bond appeared to depend to a great extent on the degree to which the triangular or fillet-shaped gold contacts were flattened, the same degree of flattening (plastic deformation) and hence, total bond definition, could be obtained with a reduced bonding force if the area of each pre-shaped contact that was brought into intimate contact with the mating terminals was made smaller. Bonding studies with a large number of lead frames in which the initially formed dual gold contacts 25 (depicted in FIG. 14) were split or bifurcated, such as with a swaging tool 45 of the type depicted in FIG. 15, proved to substantiate the original hypothesis.

With such compliant contacts, there has been an increase of over 150 percent in the 90° peel strength median value for lead frame leads and terminals of the type in question, joined by a multiple thermocompression bonding operation. More specifically, bond strengths are now consistently achieved considerably above a 227 gram minimum pull strength requirement for leads of the size in question. Concomitantly, substrate breakage has been reduced to less than 1 percent, as compared to previous typical substrate failure rates of 90 to 95 percent, utilizing conventional solid-phase bonding processes which did not incorporate pre-shaped, multiple compliant contacts for redundant bonding, as embodied in the present invention.

It should be understood, of course, that the elongated contact-forming element(s) preferably roll bonded initially to the lead frame forming-strip stock 24, need not be in the form of a precious metal circular wire(s) 40. For example, such an element could take the initial form of a rectangular or trapezoidal tape. Such configurations, however, would normally not provide the degree of plastic deformation required during the bonding and shaping operations to provide effective mechanical cleaning and reliable metal-to-metal adhesion at the bond interface(s).

It should also be readily appreciated that while the utilization of thermocompression roll bonding has been found to be the most simple, reliable and automated technique available to produce a lead frame with a compliant contact bonding medium having the unique geometry desired, and required in many very demanding bonding applications, other techniques could also be employed, albeit in a less satisfactory manner, and normally with less satisfactory end results. For example, separate compliant contacts 25, initially in the form of wire or rectangular or trapezoidal tape segments could be individually bonded or otherwise secured to each formed lead, and then cold worked to the desired shape, if the size and nature of the lead (or of any other member) permitted the use of such other techniques. This would normally prove to be quite costly and time consuming, however, because of the excessive number of repeated metal joining and forming operations required.

Still another alternative technique for producing compliant contacts of the type embodied herein would be to utilize multi-layer build-ups of evaporated or electroplated gold (or any other similar metal), wherein each successive plated layer (such as in the form of a stripe) would be of slightly narrower width than the preceding one so as to effectively produce a triangular or pyramid type of compliant contact stripe in cross-section. It becomes readily apparent, of course, that such a technique, particularly if employed in plural compliant contact forming applications, such as for use in redundant bonding, would normally involve a number of rather expensive and time consuming metal evaporation or electro-plating operations, in order to obtain compliant contact thicknesses of the order of 1 to 10 mils, as desired in the fabrication of lead frames of the type embodied herein.

Attention will now be directed in greater detail to the thermocompression roll bonding and solder coating apparatus 20, best seen in FIG. 1. As previously mentioned, this particular preferred illustrative embodiment is employed for fabricating lead frames 22 of the type depicted in FIGS. 11 and 14, having two closely spaced compliant contacts 25 per lead 30. Thereafter, as previously mentioned, these contacts may be bifurcated to form four smaller contacts 25' in space quadrature (FIG. 15).

As best seen in FIGS. 1 and 2, the composite apparatus 20 is designed to thermocompression roll bond two pairs of gold wires 40 to one side of the continuously moving strip stock 24 which, for one particular application, is composed of 0.003 inch copper. These wires 40 are preferably composed of "soft temper" gold, typically, 0.003 to 0.01 inch in diameter, and thus relatively narrow with respect to the wide flat strip stock 24. As also best seen in FIGS. 9 and 11, two narrow stripes 52 of 60Sn—40Pv solder are coated along the edges on one side of the strip stock 24 to a thickness of approximately 0.8 mils. It is thus seen that the processed, but unblanked, strip stock is formed out of three materials, namely the copper strip 24, four contact forming gold wires 40, and the aforementioned tin-lead solder stripes 52. It should be understood, of course, that any desired number of contact forming wires 40 may be employed, and comprised of a number of metals other than gold. Similarly the solder coated stripes 52 may be along either one or both edges on one side, or along selective edges on both sides, or on neither side of the strip stock, in many other applications.

As illustrated in FIGS. 1 and 2, a supply of the aforementioned strip stock 24 is fed from a supply reel 55, rotatably mounted on a suitable stand 56, through four successive operating stations, designated generally as a chemical cleaning station 60, thermocompression roll bonding station 62, a fluxing and solder coating station 64 and a lead frame blanking station 66, prior to the processed strip stock 24 being wound upon a power driven take-up reel 69, which incorporates a slip clutch.

With respect to the cleaning station 60, it is comprised of three pre-cleaning tanks 73, 75, and 77, which may contain any one of a number of suitable metal cleaning solutions, such as baths of trichlorethylene, 10% hydrochloric acid and water, respectively. A fourth tank 79 functions as a degreaser, preferably containing trichlorethylene. The first bath is employed to remove any grease and other foreign contaminants, whereas the hydrochloric acid bath is employed to remove any surface oxide on the strip stock. After passing through these baths, the strip stock is then rinsed in the water bath 77. As illustrated in FIG. 3, mutually disposed pairs of incoming water sprays 81, outgoing de-ionized water sprays 83 and air jets 85 are all associated with the rinse tank. The air jets insure that any de-ionized water droplets that may remain on the strip stock are blown off before reaching the bonding station.

All of the guide rollers associated with the cleaning tanks are commonly designated by the reference numeral 87 in FIGS. 1 and 2. They are preferably comprised of stainless steel bushings with roll end bearings made of suitable plastic materials such as nylon or that sold under the trademark Teflon, for example. Polypropylene has also been found to be a very good roller material for use in the hydrochloric acid tank. These rollers are rotatably supported on stainless steel shafts and bearings, all of which are inert with respect to the particular chemical baths employed. It has been found very advantageous to utilize conventional ultrasonic transducers (not shown) coupled to the chemical tanks 73, 75, and 79 so as to effect a chemical and ultrasonic cleaning action, in combination. The fumes that evolve, such as from trichlorethylene and hydrochloric baths are exhausted through conventional hoods 89, 91, and exhaust ducts 93, 94, respectively. These exhausted fumes may be neutralized by conventional processes for waste disposal, or removed by commercially available fume scrubbing apparatus, as required.

It should be appreciated that a mechanical cleaning operation, such as effected by steel brushing the strip stock surface, could also be employed as an alternative or supplemental operation. It has been found, however, that mechanical cleaning, by itself, has not proven to be completely satisfactory with respect to the removal of grease and certain other types of contaminants, whereas a chemical pre-cleaning operation, of the type described above, has been found to be very satisfactory in preparing the surface of the strip stock for subsequent bonding of the gold wires 40 thereto, and the coating of stripes of solder 52 along the edges thereof.

In certain very demanding applications, and depending to a great extent on the nature of the materials to be thermocompression roll bonded, it may prove beneficial to maintain the chemically cleaned strip stock in an inert atmosphere, such as of nitrogen, prior to the bonding operation so as to insure that no minute traces of oxides would develop on the strip stock. For that reason, an inert chamber designated generally by the reference numeral 95 is shown in FIG. 2, with a suitable inlet provided for pumping an inert gas under low pressure into such a chamber.

After the strip stock 24 has been chemically cleaned at station 60, it is drawn through the unique thermocompression roll bonding station 62. This station, as best seen in FIGS. 1, 5 and 6, comprises two heated and pressure biased bonding thermodes or rollers 96 and 98. These rollers are preferably composed, for example, of a nickel alloy steel, such as Inconel 718, which exhibits good heat conducting characteristics.

As best seen in the enlarged detail view in FIG. 5, the upper roller 96 in the preferred embodiment has four essentially triangular grooves 101a and 101b machined therein (only two shown) so as to pre-shape the gold wires 40 into essentially the same cross-section while being thermocompression bonded to the strip stock 24. In order to produce such a wire profile as is clearly shown in FIG. 5, each of the triangular grooves 101 has converging pressure-applying and shaping surfaces engageable with portions of its respective gold wire 40, and the cross-sectional area of the groove is less than the cross-sectional area of the wire. In addition, the upper bonding roller 96 has a slightly recessed area 96a between each pair of grooves 101, and a slightly undercut peripheral shoulder 96b adjacent to the outside edge of each triangular groove so as to allow an appreciable amount of multi-directional cold flow, or plastic deformation, which is highly desirable in order to achieve high strength bonds.

Each of the bonding rollers 96 and 98 also has a conventional cartridge type heater 103 formed in a suitable bore thereof (shown only in phantom in FIG. 6). Electrical current is supplied to the heaters 103 of bonding rollers 96 and 98, for example, from a suitable source (not shown) through external leads 104 and 105, brush contacts 106, 107, conventional slip rings 108, 109 and internal leads 111, 112, respectively. With a heater element in the range of 80 to 100 watts, the particular bonding rollers described herein can readily be heated up to 600° or 700°C, if required, for a given application.

The upper bonding roller 96, as best seen in FIG. 6, and in one illustrative embodiment, is integral with and supported by shaft extensions 115, which are rotatably supported by a pair of spaced bearing blocks 117, secured to an upper stationary platen 119. Platen 119 is, in turn, secured to the upper ends of four support rods 121. An outwardly extending shaft extension 123, journaled in a bearing block 124, is coupled through a bevel gear 126 to a mating bevel gear 127, secured to a drive shaft 129. The upper end of the drive shaft 129 is rotatably mounted on a support platen 131 which is secured to the upper platen 119. The lower end of the drive shaft 129 may be coupled to any conventional type of power source, such as an electric motor directly, or through a gear reducer (neither shown).

The lower bonding roller 98 is similarly integral with and supported by shaft extensions 132 which are rotatably supported by a pair of spaced bearing blocks 133 secured to a movable platen 134. This platen is secured to bushings 135 coaxially mounted on the support rods 121 for slidable movement relative thereto. It is readily apparent, of course, that the bonding rollers 96 and 98 could be individually mounted on separate shafts, rather than being machined with an associated shaft extension as a one-piece unit, if desired. Coupling between the upper driving bonding roller 96 and the roller driven bonding roller 98 is effected by means of a pair of sleeve-supported driving gears 136 rigidly mounted on the upper shaft extensions 115, coupled to a pair of lower sleeve-supported driven gears 137, rigidly mounted on the lower shaft extensions 132.

With respect to both bonding rollers 96 and 98, it has been found very advantageous to rotatably support integral shafts thereof on stainless steel ball bearings, with molybdenum disulfate retainer rings. Such ball bearings exhibit excellent lubrication qualities at the elevated operating temperatures.

The underside of the lower movable plate 134 is secured through a flange assembly 140 to the piston 141 of a pneumatic cylinder 142, only partially shown in FIG. 4. The pneumatic cylinder is employed to provide the desired control over the bonding pressure exerted by the bonding rollers 96 and 98 against the strip stock 24 and gold wires 40 while being drawn therethrough. It, of course, is readily possible to utilize other means for establishing the necessary bonding pressure, such as resilient springs, chosen to produce predetermined compressive or tension forces, depending on the manner in which the springs are mounted.

A pair of alignment rollers 143 and 144 are employed to insure that the strip stock is continuously aligned with and maintained in an undercut trough or channel 146. This channel is heated by a suitable cartridge heater 147, through leads 147a, so as to provide a means of preheating the strip stock 24 prior to passing through the bonding rollers.

In the illustrative application of fabricating a particular type of lead frame 22, the upper bonding roller 96, with the groove(s) 101 formed therein, is preferably maintained at a temperature in the range of 325°–365°C, whereas the lower bonding roller 98 is maintained at a temperature in the range of 200°–250°C. Bonding pressure is exerted against the copper-gold interfaces in the range of 40,000 to 60,000 pounds per square inch. These parameters are based on a bonding roller diameter of 1.5 inches, and a feed-through rate in the range of 1 to 10 feet per minute of strip stock 24.

As also illustrated in FIGS. 1 and 4, four supply spools 148a–d wound respectively with four gold wires 40a–d (only two seen in FIG. 4) are retained in four respectively associated open top containers 149a–d. The containers are arranged in space quadrature and supported on platform 151. Each of the four gold wires 40a–d, are respectively fed from an associated supply spool 148 through respectively associated eyelets made, for example, out of carbide, which exhibits excellent wear resistance. These eyelets are supported on a cross arm 153 which, in turn, is secured to a support mast 154. The gold wires 40b and 40c, after passing through their respectively associated eyelets, are fed around associated guide sheaves 156b and 156c, both rotatably mounted on a cross arm 157. The gold wires 40a and 40d, after passing through their respectively associated eyelets on the cross arm 153 are fed around guide sheaves 156a and 156d rotatably mounted on a cross arm 158. Both cross arms 157 and 158 are also secured to the support mast 154. In the preferred embodiment, conventional hysteresis brakes (not shown) are coupled to the sheaves so as to maintain the gold wires fed therearound under controlled tension. The four gold wires 40a–d, after leaving their respectively associated guide sheaves 156a–d, are fed around guide roller 159, which has four peripheral grooves formed therein, and then passed between the bonding rollers 96 and 98 in the same manner and at the same rate as the mating copper strip stock 24, with the wires and the strip in juxtaposed relationship.

After the bonding of the four gold wires 40a–d to the copper strip stock 24, the partially assembled lead frame forming strip stock may be examined through an optical viewer 158 (FIG. 2) before being drawn through the fluxing and solder stripe coating station designated generally by the reference numeral 64 in FIGS. 1 and 2.

One preferred illustrative embodiment of the fluxing apparatus, designated generally by the reference numeral 160 in FIG. 7, comprises two spaced pairs of upper and lower rollers 162 and 163, respectively (only one roller of each pair seen in FIG. 7), and a flux tank 164. The upper rollers 162 are rotatably mounted on a common shaft 165 which is suitably mounted at opposite ends on two spaced brackets or bearing blocks 166. The lower pair of rollers 163 are similarly mounted for rotatable movement on a common shaft 167 which, in turn, is suitably mounted at opposite ends on a pair of spaced brackets or bearing blocks 168 secured to a main support stand 171 of the composite apparatus.

The upper pair of rollers 162 are movably positioned relative to the lower pair of rollers 163 by means of four support rods 172 which are threadably secured at their lower ends in bores of the lower brackets 168. Rods 172 extend upwardly through aligned bores in the upper support brackets 166 so as to allow the latter to slide along the rods. A coil spring 173 is coaxially mounted on each support rod 172 between an upper head portion thereof and a flange portion of the upper bracket. In this manner, the spring bias between the rollers may be readily controlled. The lower pair of rollers 163 preferably are formed with porous outer surface peripheries so as to carry an appreciable amount of flux out of the flux tank 164 for wetting the strip stock 24. For this purpose, the two spaced lower rollers 163, in particular, are each dimensioned to have a peripheral width that corresponds with the associated narrow stripe of solder 52 to be coated on the fluxed area thereafter.

After passing through the fluxing apparatus 160, the partially processed strip stock 24 is then drawn through a solder coating apparatus designated generally by the reference numeral 175 in FIGS. 7 and 8. This apparatus comprises a molten solder pot 177, an outer overflow reservoir 179, and a pump 181 (see FIG. 7). An external conventional heater 183 of any suitable type, shown only symbolically in phantom outline in FIG. 7, may be employed to maintain the re-circulating solder in a molten state. It is apparent, of course, that internal heaters could also be employed with equal effectiveness.

The solder pot 177 is substantially enclosed at the top thereof by a specially shaped cover member 185 (best seen in FIG. 8). Member 185 has two mutually disposed central openings 186a,b formed therein, separated by a tapered nose portion 185a of the cover member 185. Two adjustable nozzle-defining members 187a,b are mounted for retractable movement, toward and away from each other, on the upper surface of the cover member 185 (by suitable fastening means not shown). Nozzle members 187a and b have respective tapered and inclined bore-defining nozzles 189a and b formed therein (see FIGS. 7 and 8). Molten solder is not shown in the nozzles in FIG. 8 in the interest of structural clarity.

With nozzle members 187a and b being adjustably mounted, and with the diameter of the nozzle openings therein being smaller than the respectively aligned openings 186a and b in the cover member 185, the spacing between nozzles 189a and b may be readily adjusted within the limits defined by the size of the cover member openings 186a and b. In this manner, the molten solder may be directed against the desired regions along the underside of the exposed strip stock 24 so as to form the spaced solder coated stripes 52 as depicted in FIG. 9. The excess solder that does not adhere to the exposed surfaces of the strip stock is returned by gravity flow along grooves (not shown) formed in the upper surface of the cover member 185.

As best seen in FIG. 8, a T-shaped member 190 functions as both a masking and support member for the underside of the strip stock 24. T-shaped member 190 is secured within an upper channel (not shown) formed in a heater block 191 (see FIG. 7). The T-shaped member 190 has a central undercut channel 190a formed therein, which is oriented in the longitudinal direction of the strip stock, and is dimensioned so as to provide an air gap between the base of the channel and the central region of the underside of the strip stock. As such, the underside of the strip stock only contacts and is supported by the outer raised shoulders defining the side boundaries of the T-shaped member channel 190a. This undercut channel is thus seen not only to provide clearance for the previously bonded gold wire(s), but to minimize heat transfer to the central bonded wire region of the strip stock 24 while being drawn thereover. The T-shaped member 190 is preferably composed of stainless steel, with the upper surfaces of the outer shoulders defining the channel 190a being highly polished so as to minimize friction with and to insure effective masking of the strip stock 24.

An upper strip stock biasing assembly designated generally by the reference numeral 192, as best seen in FIG. 7, comprises an outer inverted U-shaped member 194, the aforementioned internal heater block 191 secured thereto, and a spring biased member 198 inserted within an opening and movable relative to the U-shaped member 194. The heater block 191 has two heater cartridges 199 mounted within bores formed therein (see FIG. 7) so as to maintain the strip stock at a desired temperature to facilitate the coating of solder thereon. Member 194 is rigidly supported to the lower ends of four support rods 201, the upper ends of which are secured within bores of a support platform 203. The platform is attached through a block 205 and cross arm 207 to the floor mounted frame 171, which also supports the fluxing apparatus 160.

The upper spring biased member 198, as in the case with the tapered nose portion 185a of the cover member 185 is preferably formed of stainless steel with a highly polished lower surface which frictionally engages the upper surface of the strip stock 24. Member 198 also has a central bore which loosely receives the lower end of a threaded support rod 213. This support rod extends through an oversize bore in the platform 203, with an upper head portion to facilitate turning. A coil spring 216 is coaxially mounted on the support rod 213 between a collar 218 and the under surface of the platform 203. In this manner, the spring bias exerted by the upper biasing member 198 against the mating surface of the strip stock can be readily adjusted.

Two rotatable guide rollers 221 and 222 (FIG. 7) are further employed to facilitate the alignment of the strip stock 24 and the biasing thereof against the lower masking member 190. These rollers are supported on brackets 224 which, in turn, are secured to the support platform 203.

In the preferred composite embodiment of the apparatus as depicted in FIGS. 1 and 2, there are actually two soldering mechanisms 175 in tandem, of the type best seen in FIGS. 7 and 8. The reason for this is to provide greater control over the thickness of the solder coatings, when required. For most applications, a single pass through only one soldering mechanism 175 is sufficient, and readily capable of producing solder coatings up to at least 1 mil in thickness.

After forming the two solder stripes 52 (FIGS. 9–11) along the longitudinal edges of the partially processed strip stock 24, it is guided through a series of guide rollers 87 into the fourth aforementioned degreaser tank 79 (FIGS. 1 and 2) containing, for example, trichlorethylene. This bath is employed to remove any excess flux, as well as other contaminants which could possibly have come in contact with the strip stock after its having been previously chemically cleaned. Chemical tank 79, as chemical tank 73, is preferably made of stainless steel, and has a hood 89 which is coupled to the common exhaust system 93.

After the partially fabricated strip stock 24 is drawn out of the degreaser tank 79, it may either be re-wound directly on the power driven, slip clutch controlled take-up reel 69 or, alternatively, first passed through a pair of drive rollers 227 and 228, coupled to a controllable, unidirectional power source, such as an electric motor 231, shown only in FIGS. 1 and 2. As best seen in FIG. 2, the drive rollers are rotatably mounted on a support bracket 234 which, in turn, is secured to a platform 237. Platform 237 is secured to a main frame 239. The motor 231 is mounted on a block 243 secured to the platform 237, and is directly gear-coupled to the drive roller 227 (see FIG. 1).

Upon passing through the drive rollers, and if a blanking operation is to immediately follow, a dead-loop of processed strip stock 24 is formed so as to facilitate the incremental feeding thereof through punch and die apparatus designated generally by the reference numeral 245, preferably of the progressive type, shown only symbolically in FIGS. 1 and 2.

Figure 10:
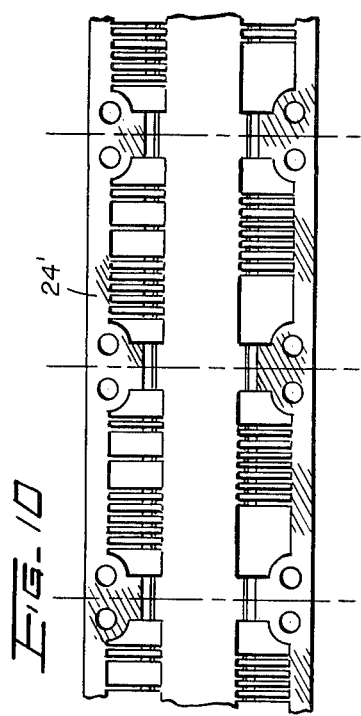
FIG. 10 is an enlarged, fragmentary plan view of the partially fabricated strip stock depicted in FIG. 9, but after a blanking operation so as to form a skeleton comprising a series of interconnected lead frames, each having two mutually disposed arrays of leads.

This apparatus 245 is also supported on the main frame 239, and is employed to form pilot holes in the strip stock (to facilitate the alignment thereof), then blank out the lead frame skeleton 24', as depicted in FIG. 10, bifurcate the compliant lead contacts, if desired and, thereafter, blank out the individual lead frames 22 of the type depicted in FIG. 11, unless the lead frame skeleton 24' is to be re-wound on the take-up reel 69 for later use.

In any case, whenever the individual lead frames 22 are to be severed from the strip stock skeleton 24', and it is desired to provide bifurcated contacts 25' of the type depicted in FIG. 15, the blanking tooling for severing each lead frame would preferably incorporate, or be preceded by, swaging tooling 45 of the type depicted in FIG. 15. During the blanking out of each individual lead frame 22, the longitudinally extending central rib of the lead frame skeleton 24' is also blanked out, leaving the leads 30 with inwardly extending free ends, ready for bonding to a mating member, as depicted in FIGS. 11, 16 and 17.

The final bonding operation may be readily accomplished by utilizing two independently heated and pivotally mounted thermocompression bonding wedges 36 (only one shown symbolically in FIG. 17) which are simultaneously brought down into engagement with a different one of the two aligned arrays of leads and terminals.

During the multiple lead frame bonding operation, the triangular shaped and bifurcated contacts 25' of each lead are advantageously flattened sufficiently, as depicted in FIG. 17, so as to insure effective mechanical cleaning and metal-to-metal solid-phase adhesion at the bond interfaces, while at the same time inherently producing sufficient compliancy to minimize, if not completely eliminate, substrate failures due to fracture and/or glass cavitation. Thereafter, the outer peripheral border of the lead frame 22 is trimmed from the bonded leads by any suitable means.

The complete sequence of operating steps involved in the fabrication of a lead frame 22 with four compliant contacts 25' bonded to each lead, and the multiple bonding of the leads thereafter to mating thin film electrical terminals, in accordance with the principles of the present invention, is illustrated in the flow chart depicted in FIG. 18.

As previously mentioned, for a lead with four compliant contacts 25' of the type depicted in FIG. 15, a bonding pressure of approximately 4 pounds per lead connection, a bonding temperature of approximately 600°C, and a bonding period of approximately 0.8 seconds, has been found to produce lead-terminal redundant bonds exhibiting 90° peel strengths above 225 grams. This is an exceptionally strong bond for a lead only 3 mils thick and 15 mils wide. Even more significant, however, is the fact that lead frames of the type in question have reduced bond failures in one particular solid-state circuit lead packaging application to less than 1 percent, from a previous rate of approximately 90 to 95 percent with no interposed and pre-shaped compliant contacts employed.

In summary, the present invention is directed to methods for producing high quality, solid-phase bonds between two mating members and, in particular, between a micro-size lead and thin film terminal, utilizing at least one, but preferably two or more specially contoured and interposed compliant contacts. The pre-shaping of the compliant contacts into essentially triangular cross-section has been found to be very beneficial and significant in establishing a sufficient degree of inherent compliancy to minimize, if not eliminate, force-induced substrate failures due to fracture or glass cavitation, and to provide sufficient plastic deformation at the bond interfaces to insure the attainment of reliable and consistent mechanical cleaning, bond definition, and metal-to-metal adhesion characteristics. The utilization of two or more pre-shaped compliant contacts per bond area, so as to produce redundant bonds, further insures against total bond and/or substrate failures due to the presence of random mating bond surface micro-imperfections.

What is claimed is:

1. A method of solid-phase bonding a first metallic member to a second metallic member, comprising:
    solid-phase bonding a compliant metallic medium to the first metallic member;
    simultaneously shaping the metallic medium into a cross-sectional profile having a raised compliant crest region which is smaller in surface area at an outer portion thereof than a base-interface of the medium with the first metallic member; and
    solid-phase bonding the first metallic member to the second metallic member, with the compliant metallic medium interposed therebetween and the second metallic member engaged with the small outer portion of the raised compliant crest region, by the application of at least a metal working force exerted on the preshaped compliant crest region of the medium through at least one of said first and second metallic members in the direction of the other member, the compliant crest region being slightly depressed and tangentially cold-flowed by the metal working force so as to effect mechanical cleaning of the second member-medium interface and to produce a reliable adhering bond at the second member-medium interface of enlarged cross-sectional area as compared to the initial surface area of the small outer portion of the raised compliant crest region.

2. A method in accordance with claim 1 wherein said first member is in the form of a metallic electrical lead having a flat bonding surface, and said second member is a metallic terminal having a flat bonding surface.

3. A method in accordance with claim 1 wherein both heat and pressure are exerted on the compliant crest region of said metallic medium to produce a thermocompression bond between said first and second metallic members.

4. A method in accordance with claim 1 further comprising the step of:
swaging the metallic medium with the raised compliant crest region into at least two smaller and separated compliant contacts so as to produce a subsequent redundant bond between said first and second members.

5. A method in accordance with claim 1 wherein said medium is shaped into an essentially triangular cross-section.

6. A method of bonding an electrical lead having a flat bonding surface to an associated terminal having a flat bonding surface with inherent bonding compliancy established therebetween, comprising the steps of:
bonding at least one metallic member to a flat terminating end region of the lead;
shaping the metallic member into a cross-sectional profile having a raised compliant crest region which is smaller in surface area at an outer portion thereof than a base-interface of the metallic member with the lead; and
bonding the lead to the associated terminal, with the pre-shaped metallic member interposed therebetween and the terminal engaged with the small outer portion of the raised compliant crest region, by the application of at least a metal working force exerted on the crest region of the metallic member through the lead and terminal, the crest region being slightly depressed and tangentially cold-flowed by the metal working force so as to effect mechanical cleaning and to produce a reliable bond of enlarged cross-sectional area as compared to the initial surface area of the small outer portion of the raised compliant crest region, in the absence of a liquid phase, at the member-terminal interface.

7. A method in accordance with claim 6 further comprising the step of:
swaging the crest-formed member into at least two smaller and separated compliant contacts so as to produce a subsequent redundant bond between the lead and terminal.

8. A method in accordance with claim 6 wherein at least two closely spaced compliant members are bonded to said lead, with both members being formed with compliant crests so as to produce a subsequent redundant bond between the lead and terminal.

9. A method in accordance with claim 8 further comprising the step of:
swaging each crest-formed member into at least two smaller and separated compliant contacts, so as to produce a subsequent redundant bonded connection between the lead and terminal comprised of at least four distinct bond interface sites.

10. A method of continuous thermocompression roll bonding and shaping an elongated metallic element on a flat metal strip, which comprises:
continuously advancing an elongated metallic element of an essentially circular cross-sectional configuration and the flat metal strip longitudinally into engagement with one another; and
applying continuous heat and pressure to the engaged elongated metallic element and the metal strip to cause both predetermined normal and tangential cold flow of the material of the metallic element, to produce mechanical cleaning and a solid-phase metal-to-metal bond at the metallic element-metal strip interface while simultaneously shaping the metallic element from its initial essentially circular cross-sectional configuration to a second cross-sectional configuration having at least one longitudinally extending and essentially triangular compliant crest region which is smaller in surface area at an outer portion thereof than a base-interface of the metallic element with the metal strip.

11. A method in accordance with claim 6 in which:
the metallic member and the lead are formed by thermocompression roll bonding precious metal wire to a metal strip and then blanking the wire and the metal strip to produce the lead having a precious metal compliant member thereon.

12. A method in accordance with claim 11, wherein the metal strip is of wide flat construction with respect to the precious metal wire, and in which:
the precious metal wire is thermocompression roll-bonded to the wide metal strip and shaped into the cross-sectional profile having the raised compliant crest region, simultaneously.

13. A method in accordance with claim 11 wherein the roll bonding is carried out at temperatures in the range of 200°–400°C., with a pressure in the range of 40,000 to 60,000 pounds per square inch exerted between the precious metal wire and the metal strip, while advancing the wire and metal strip at a rate in the range of 1 to 10 feet per minute.

* * * * *

UNITED STATES PATENT OFFICE
CERTIFICATE OF CORRECTION

Patent No. 3,939,559      Dated February 24, 1976

Inventor(s) Richard L. Fendley, Gerhard E. Hoenig, George Poehlmann and John M. Prendergast, Jr.

It is certified that error appears in the above-identified patent and that said Letters Patent are hereby corrected as shown below:

Patent front page, item [73] delete "Bell Telephone Laboratories, Incorporated, Murray Hill, New Jersey". Item [73] should read "Assignee: Western Electric Company, Inc. New York, New York."

Signed and Sealed this

Seventh Day of September 1976

[SEAL]

Attest:

RUTH C. MASON
*Attesting Officer*

C. MARSHALL DANN
*Commissioner of Patents and Trademarks*